United States Patent
Noh

(10) Patent No.: US 7,688,641 B2
(45) Date of Patent: Mar. 30, 2010

(54) METHOD OF DEPRESSING READ DISTURBANCE IN FLASH MEMORY DEVICE

(75) Inventor: Keum-Hwan Noh, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 25 days.

(21) Appl. No.: 11/965,548

(22) Filed: Dec. 27, 2007

(65) Prior Publication Data
US 2009/0003080 A1    Jan. 1, 2009

(30) Foreign Application Priority Data
Jun. 29, 2007    (KR) .................... 10-2007-0065845

(51) Int. Cl.
*G11C 11/34* (2006.01)
(52) U.S. Cl. .................... 365/185.25; 365/185.24
(58) Field of Classification Search ............ 365/185.25, 365/185.24
See application file for complete search history.

(56) References Cited

U.S. PATENT DOCUMENTS

| | | | |
|---|---|---|---|
| 6,380,033 B1 | 4/2002 | He et al. | |
| 7,085,165 B2 | 8/2006 | Wu | |
| 7,177,977 B2 | 2/2007 | Chen et al. | |
| 2005/0018485 A1* | 1/2005 | Noguchi et al. | 365/185.17 |
| 2007/0291542 A1* | 12/2007 | Aritome | 365/185.18 |
| 2008/0056008 A1* | 3/2008 | Aritome et al. | 365/185.24 |
| 2008/0089130 A1* | 4/2008 | Park | 365/185.18 |
| 2008/0158973 A1* | 7/2008 | Mui et al. | 365/185.18 |

FOREIGN PATENT DOCUMENTS

| | | |
|---|---|---|
| KR | 1019990045036 A | 6/1999 |
| KR | 1020060082307 A | 7/2006 |
| KR | 100621634 B1 | 8/2006 |
| KR | 1020070035360 A | 3/2007 |

* cited by examiner

*Primary Examiner*—Michael T Tran
(74) *Attorney, Agent, or Firm*—Townsend and Townsend and Crew LLP

(57) ABSTRACT

A method of reading a NAND flash memory device includes a cell string having a drain selection transistor, a plurality of memory cells and a source selection transistor which are in series connected to each other. The method comprises the steps of applying a first voltage to a gate of the drain selection transistor in order to turn on the drain selection transistor, applying a read voltage to a gate of a selected memory cell among the plurality of memory cells, and applying first and second pass voltages to gates of unselected memory cells of the plurality of memory cells, wherein the first pass voltage of a relatively high level is applied to the gates of the unselected memory cells which are adjacent to the selected memory cell and wherein the second pass voltage of a relatively high level is applied to the gates of the unselected memory cells which are not adjacent to the selected memory.

18 Claims, 4 Drawing Sheets

US 7,688,641 B2

METHOD OF DEPRESSING READ DISTURBANCE IN FLASH MEMORY DEVICE

CROSS-REFERENCES TO RELATED APPLICATION

The present application claims priority to Korean application number 10-2007-0065845, filed on Jun. 29, 2007, which is incorporated by reference in its entirety.

BACKGROUND OF THE INVENTION

The present invention relates to a method of reading a flash memory device and, more particularly, to a method of reducing a read disturbance in a flash memory device.

Flash memory devices are widely used in electronic applications that need non-volatile memory devices. The flash memory cell has a one-transistor structure, which provides high density, high reliability and low current consumption. The flash memory devices are used in personal computers, personal digital assistants, digital cameras, cellular phones, etc. Also, program code, system data [e.g., basic input/output system (BIOS)] and firmware can be stored in the flash memory device. Flash memory devices, especially a NAND flash memory device, are more and more widely used because it can achieve high memory density with a relatively low cost.

As shown in FIG. 1, a NAND flash memory device includes a plurality of cell strings. A cell string 100 has a structure that includes a drain selection transistor 110, a plurality of cell transistors 131 to 134 and a source selection transistor which are connected in series. A drain of the drain selection transistor 110 is connected to a bit line BL and a source is connected to a drain of the cell transistor 131. A gate of the drain selection transistor 110 is connected to a drain selection line DSL. Gates of the cell transistors 131 to 134 are respectively connected to the word lines WL1 to WL4. A drain of the source selection transistor 120 is connected to a source of the cell transistor 134 and a source is connected to a common source line CSL. A gate of the source selection transistor 120 is connected to a source selection line SSL. Typical MOS transistors are used as the drain selection transistor 110 and the source selection transistor 120 and floating gate transistors are used as the cell transistors 131 to 133.

The cell transistors 131 to 133 are in an erase state or program state according to a threshold voltage of each cell transistor. The cell transistors have a relatively low voltage in the erase state, for example, a threshold voltage lower than 0V. Meanwhile, the cell transistors have a relatively high voltage in the program state, for example, a threshold voltage higher than 0V. A read operation, which needs to distinguish the state of a cell transistor, is done by applying a read voltage to the selected cell transistor and by distinguishing whether the selected cell transistor is turned on or off. For example, a voltage of 0V is applied to a word line of the selected transistor. That is, if the selected transistor is turned on, the selected transistor is in the erase state, because the threshold voltage is lower than the read voltage. Meanwhile, if the selected transistor is turned off, the selected transistor is in the program state, because the threshold voltage is higher than the read voltage.

However, when such a read operation is done repetitively, a read disturbance can occur. The read disturbance is a phenomenon where a threshold voltage of an erased cell transistor becomes abnormally high so that the transistor is incorrectly read in the program state. Several phenomena are suggested as a mechanism to cause such a read disturbance and one of them is caused by a hot carrier.

Specifically, as shown in FIG. 2, in the case of reading a cell transistor 132, a read voltage Vread of approximately a voltage of 0V is applied to a word line WL2 of the selected cell transistor 132 and a pass voltage Vpass higher than the read voltage Vread, (e.g., approximately 5V) is applied to unselected cells (e.g., the remaining word lines WL3 and WL4 of the remaining cell transistors 133 and 134). However, channel boosting by the pass voltage Vpass applied to the word line WL3 of the cell transistor 133 can occur. The cell transistor 133 is adjacent to the selected cell transistor 132 and thus a strong horizontal electric field and a strong vertical electric field are formed as indicated by arrows 241 and 242 in the drawing. As indicated by an arrow 243 in the drawing, electrons which come from an off-leakage current caused within a channel of the selected cell transistor 132 become hot carriers of high energy in the horizontal electric field and the vertical electric field and are injected into a floating gate FG of the adjacent cell transistor 133. Then, a threshold voltage of the adjacent cell transistor 133 increases and may be placed in an abnormal program state by the read disturbance phenomenon.

SUMMARY OF THE INVENTION

In an aspect of the present invention, a method of reading a NAND flash memory device, which includes a cell string having a drain selection transistor, a plurality of memory cells and a source selection transistor which are in series connected to each other, comprises: applying a first voltage to a gate of the drain selection transistor in order to turn on the drain selection transistor; applying a read voltage to a gate of a selected memory cell among the plurality of memory cells; and applying first and second pass voltages to gates of unselected memory cells of the plurality of memory cells, wherein the first pass voltage of a relatively high level is applied to the gates of the unselected memory cells which are adjacent to the selected memory cell and wherein the second pass voltage of a relatively high level is applied to the gates of the unselected memory cells which are not adjacent to the selected memory.

In another aspect of the present invention, a method of reading a NAND flash memory device which includes a cell string having a drain selection transistor, a plurality of memory cells and a source selection transistor which are in series connected to each other, wherein the drain selection transistor is connected to each bit line, the method comprises: applying a precharge voltage to a selected bit line connected to the cell string including a selected memory cell; applying a ground voltage, for example 0V to other bit lines besides the selected bit line; applying a first voltage to a gate of the drain selection transistor in order to turn on the drain selection transistor; applying a read voltage to a gate of the selected memory cell among the plurality of memory cells; applying first and second pass voltages to gates of unselected memory cells of the plurality of memory cells, wherein the first pass voltage of a relatively high level is applied to the gates of the unselected memory cells which are adjacent to the selected memory cell and wherein the second pass voltage of a relatively high level is applied to the gates of the unselected memory cells which are not adjacent to the selected memory; applying a second voltage to a gate of the source selection transistor in order to turn on the source selection transistor;

and distinguishing whether the selected memory cell is in a program or erase state by detecting a change in voltage of the selected bit line.

DETAILED DESCRIPTION OF THE PREFERRED EMBODIMENTS

Figure 1:
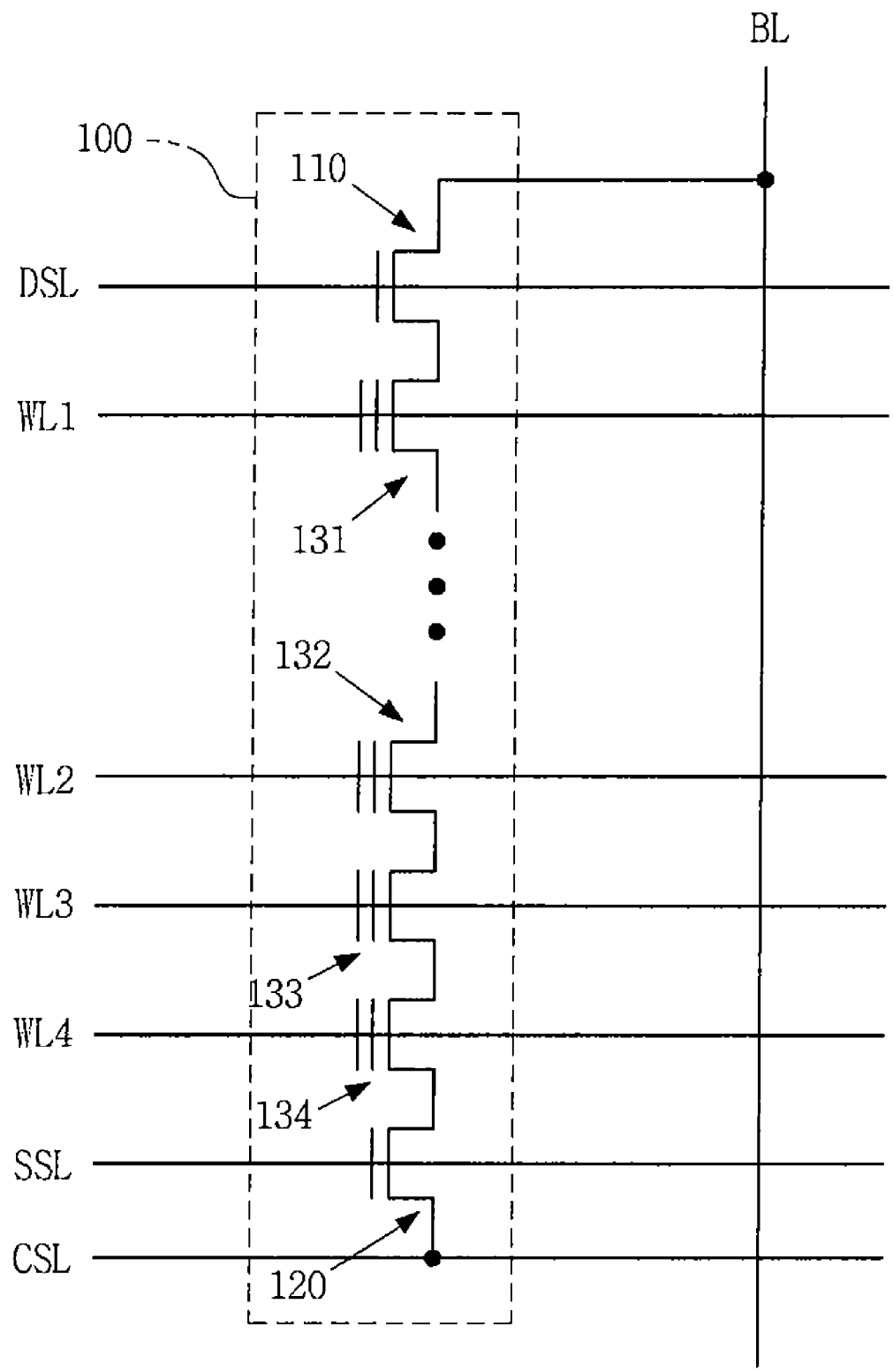
FIG. 1 is a circuit diagram showing a cell string of a conventional NAND flash memory device.
Figure 2:
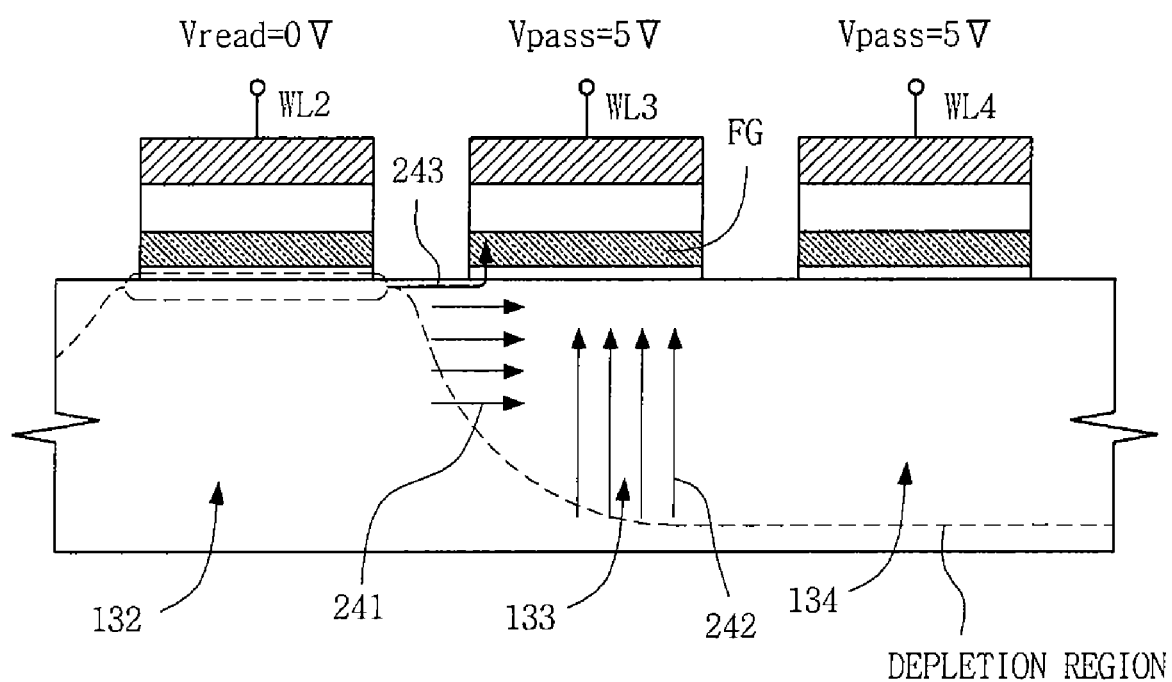
FIG. 2 is a cross sectional view showing the cell string of FIG. 1 and a read disturbance phenomenon.
Figure 3:
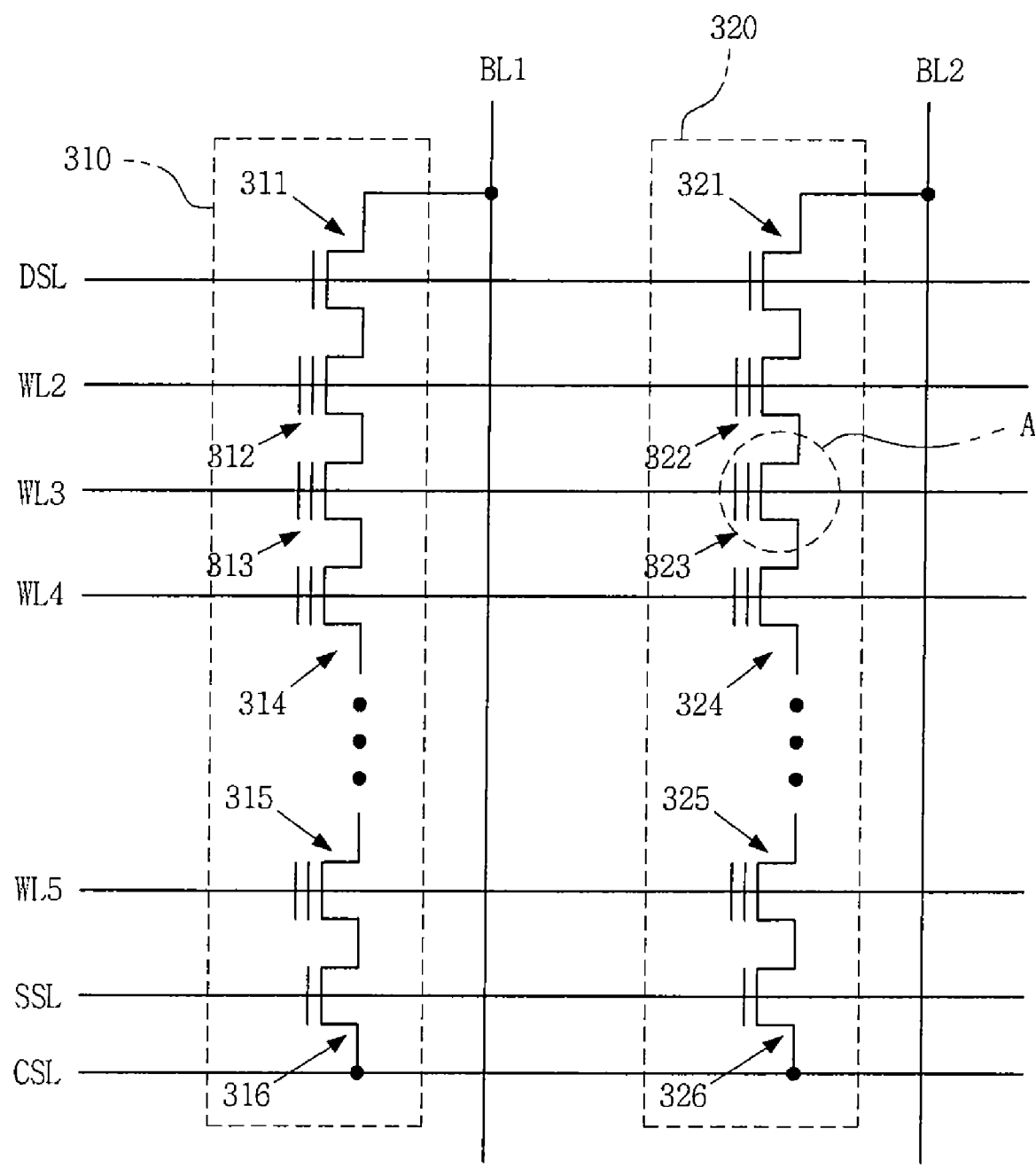
FIG. 3 is a circuit diagram showing a read operation of a NAND flash memory device.
Figure 4:
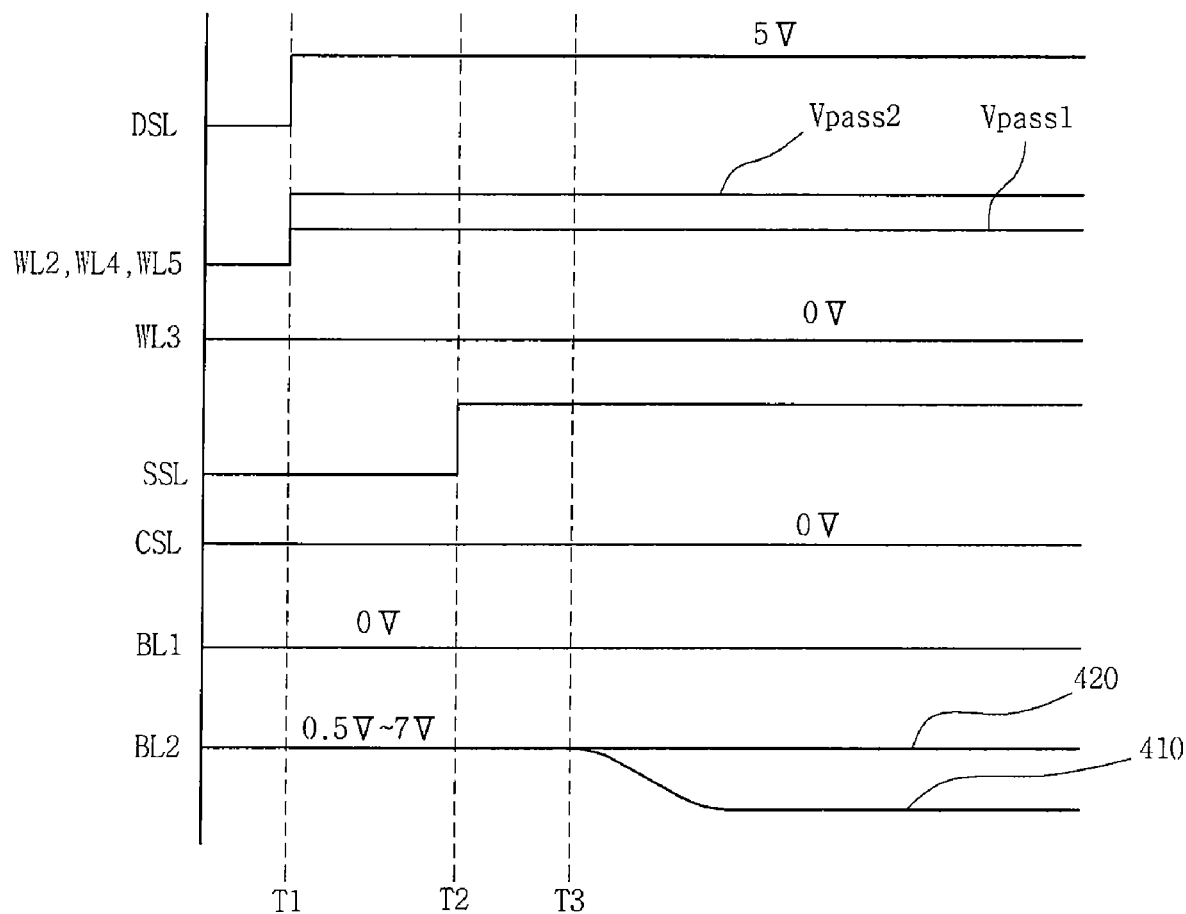
FIG. 4 is a timing chart illustrating a read operation of the NAND flash memory device according to the present embodiment.

FIG. 3 is a diagram showing a read operation of a NAND flash memory device and FIG. 4 is a timing illustrating a read operation of a flash memory device according to the present embodiment. Referring to FIG. 3, a first cell string 310 is connected to a first bit line BL1. The first cell string 310 has a structure that includes a first drain selection transistor 311, a plurality of cell transistors (or memory cells) 312 to 315 and a first source selection transistor 316 which are connected in series. The first bit line BL1 is connected to a drain of the first drain selection transistor 311. A source of the first source selection transistor 316 is connected to a common source line CSL. A second cell string 320 is connected to a second bit line BL2. The second cell string 320 has a structure that includes a second drain selection transistor 321, a plurality of cell transistors 322 to 325 and a second source selection transistor 326 which are connected in series. The second bit line BL2 is connected to a drain of the second drain selection transistor 321. A source of the second source selection transistor 326 is connected to the common source line CSL.

Gates of the first and second drain selection transistors 311 and 321 are commonly connected to a drain selection line DSL. Gates of the first and second source selection transistors 316 and 326 are commonly connected to a source selection line SSL.

A word line WL2 is connected to control gates of cell transistors 312 and 322. A word line WL3 is connected to control gates of cell transistors 313 and 323. A word line WL4 is connected to control gates of cell transistors 314 and 324. A word line WL5 is connected to control gates of cell transistors 315 and 325. As shown in FIG. 3, each of the bit lines BL1 and BL2 and each of the cell strings 310 and 320 form a column of a memory cell array. The word lines WL2 to WL5 form rows of the memory cell array.

In the memory cell array having such a structure, a method of reading whether the cell transistor 323 (section "A" in FIG. 3) is in a program or erase state will be illustrated below with reference to the timing diagram of FIG. 4.

First, a bit line is precharged (not shown in FIG. 4). Specifically, the selected second bit line BL2 connected to the second cell string 320 including the selected cell transistor 323 is precharged to a supply voltage between approximately 0.5V to 7V (e.g., approximately 1V). The unselected first bit line BL1 is provided with ground voltage, for example 0V. Next, at a first timing T1, a turn-on voltage of the drain selection transistor (e.g., approximately 5V) is applied to the drain selection line DSL. The second drain selection transistor 321 is turned on by the turn-on voltage. Also, a read voltage Vread (e.g., approximately 0V) is applied to the word line WL3 of the selected cell transistor 323 at the first timing T1 and a pass voltage Vpass is applied to the word lines WL2, WL4 and WL5 of the unselected cell transistors 322, 324 and 325. A rising edge of a pulse of the pass voltage Vpass is generated at the same time as the generation of a rising edge of a turn-on voltage pulse applied to the drain selection line DSL. The pass voltage Vpass is of a level capable of turning on the unselected cell transistors 322, 324 and 325 regardless of whether they are in the program state.

The pass voltage Vpass is not equally applied to the word lines WL2, WL4 and WL5 of the unselected cell transistors 322, 324 and 325. Specifically, among the unselected cell transistors 322, 324 and 325, a first pass voltage Vpass1 of a relatively low level is applied to the word lines WL2 and WL4 of the cell transistors 322 and 324 adjacent to the selected cell transistor 323. Meanwhile, a second pass voltage Vpass2, which is relatively higher than the first pass voltage Vpass1, is applied to the word line WL5 of the unselected cell transistor 325 which is not adjacent to the selected cell transistor 323. The first pass voltage Vpass1 may be approximately 3V to 6V and the second pass voltage Vpass2 may be set to be larger than the first pass voltage Vpass1 by approximately 0.5V (e.g., 0.3-0.7V).

Channels of the cell transistors 322 and 324 are boosted by applying the relatively low pass voltage Vpass1 to the word lines of the cell transistors 322 and 324, which are adjacent to the selected cell transistor 325, among the unselected cell transistors 322, 324 and 325. However, the electrons within the channel of the adjacent selected cell transistor 323 are prevented from becoming the hot carriers and thus read disturbance by the hot carriers is suppressed, by relatively weakening an extent of channel boosting and also reducing a strength of the electric field.

Next, at a second timing T2, a turn-on voltage of the source selection transistor 326 is applied to the source selection line SSL. Then, the channel boosting of the unselected cell transistors 322, 324 and 325 is gently maintained with an occurrence of the hot carriers to be mitigated. In this case, if the selected cell transistor 323 is turned on, a path through which electric charges move following the second cell string 320 is formed, but if the selected cell transistor 323 is turned off, the path through which the electric charges move following the second cell string 320 is not formed.

At a third timing T3, after a predetermined time passes from the second timing T2, the second bit line BL2, which is precharged according to a state of the selected cell transistor 323, is discharged or maintained as it is. That is, if the path through which the electric charges move following the second cell string 320 is formed, the second bit line BL2, which is precharged, is discharged to a cell source line CSL (referred to as "410" in FIG. 4). Meanwhile, if the path through which electric charges move following the second cell string 320 is not formed, the second bit line BL2, which is precharged, is not discharged, but maintained as it is (Referred to as "420" in FIG. 4). Therefore, the second bit line BL2 is detected whether it is discharged or not and, if it is discharged, the selected cell transistor 323 is turned on so that the selected transistor is determined to be in the erase state. Meanwhile, if the second bit line BL2 is not discharged, the selected cell transistor 323 is turned off so that the selected transistor is determined to be in the program state. Accordingly, whether the second bit line BL2 is discharged or not can be more accurately distinguished after a sufficient time has passed.

According to the method of reading a NAND flash memory device in the present invention, by applying a pass voltage, which is relatively lower than a pass voltage applied to a word line of an unselected cell transistor, to a word line of another cell transistor adjacent to a selected cell transistor, the hot carriers do not occur within a channel of the selected cell transistor and thus an occurrence of the read disturbance in the adjacent cell transistor by the hot carriers can be suppressed. Furthermore, since the hot carriers do not occur, the reliability and retention characteristic of a device can be improved.

What is claimed is:

1. A method of reading a NAND flash memory device which includes a cell string having a drain selection transistor, a plurality of memory cells and a source selection transistor which are connected in series, the method comprising:
   applying a first voltage to a gate of the drain selection transistor in order to turn on the drain selection transistor;
   applying a read voltage to a gate of a selected memory cell among the plurality of memory cells; and
   applying first and second pass voltages to gates of unselected memory cells of the plurality of memory cells,
   wherein the first pass voltage is applied to the gates of the unselected memory cells that are adjacent to the selected memory cell, and the second pass voltage is applied to the gates of the unselected memory cells that are not adjacent to the selected memory cell,
   wherein the first pass voltage is lower than the second pass voltage.

2. The method of claim 1, wherein the first pass voltage and the second pass voltage are applied at substantially the same time as the first voltage turns on the drain selection transistor.

3. The method of claim 1, wherein the first pass voltage is set to be 3V to 6V.

4. The method of claim 1, wherein the first pass voltage is sufficiently high to turn on the memory cells that are adjacent to the selected memory cell but sufficiently low not to generate a significant amount of hot carriers within a channel of the selected memory cell.

5. The method of claim 1, further comprising applying a second voltage to a gate of the source selection transistor in order to turn on the source selection transistor.

6. The method of claim 5, wherein the second voltage is applied after the first voltage, the first pass voltage and the second pass voltage are applied.

7. The method of claim 1, further comprising:
   applying a precharge voltage to a bit line connected to the cell string including the selected memory cell; and
   applying a ground voltage to a bit line not connected to the cell string including the selected memory cell.

8. The method of claim 7, wherein the precharge voltage is applied as a supply voltage.

9. The method of claim 7, wherein the precharge voltage is set to be 0.5V to 7V.

10. The method of claim 1, wherein the first pass voltage is about 0.5V lower than the second pass voltage.

11. The method of claim 1, wherein the first pass voltage is no more than about 0.7V lower than the second pass voltage.

12. The method of claim 11, wherein the first pass voltage is at least about 0.3V lower than the second pass voltage.

13. The method of claim 1, wherein the first pass voltage is no more than about 1V lower than the second pass voltage.

14. A method of reading a NAND flash memory device including first and second cell strings, the method comprising:
   applying a precharge voltage to a bit line connected to a first cell string including a selected memory cell;
   applying a ground voltage to a second bit line not connected to the cell string including the selected memory cell;
   turning on a drain selection transistor of the first cell string;
   applying a read voltage to a gate of the selected memory cell of the first cell string;
   applying a first pass voltage to a memory cell adjacent to the selected memory cell;
   applying a second pass voltage to a memory cell that is not adjacent to the selected memory cell, the first pass voltage being lower than the second pass voltage; and
   determining whether the selected memory cell is in a program state or an erase state based on a voltage level of the first bit line.

15. The method of claim 14, wherein the first pass voltage is about 0.5V lower than the second pass voltage.

16. The method of claim 14, wherein the second pass voltage is no more than about 0.7V higher than the first pass voltage.

17. The method of claim 16, wherein the second pass voltage is at least about 0.3V higher than the first pass voltage.

18. The method of claim 14, wherein the first pass voltage is lower than the second pass voltage by 1V or less.

* * * * *